(12) United States Patent
Chang

(10) Patent No.: US 6,646,562 B1
(45) Date of Patent: Nov. 11, 2003

(54) HOOKING-TYPE FULLY AUTOMATIC ELECTRIC METER

(75) Inventor: Shan-Wen Chang, Taipei (TW)

(73) Assignee: APPA Technology Corp., Taipei (TW)

( * ) Notice: Subject to any disclaimer, the term of this patent is extended or adjusted under 35 U.S.C. 154(b) by 0 days.

(21) Appl. No.: 10/155,007

(22) Filed: May 28, 2002

(51) Int. Cl.[7] ............................................. G08B 21/00
(52) U.S. Cl. ...................... 340/664; 340/635; 340/657; 324/115
(58) Field of Search ................................ 340/664, 635, 340/657, 660, 595, 596; 324/435, 72.5, 115, 127, 129, 691, 99 D; 702/57, 64, 65

(56) References Cited

U.S. PATENT DOCUMENTS

| | | | | |
|---|---|---|---|---|
| 4,092,591 A | * | 5/1978 | Lozowski | 324/110 |
| 4,520,310 A | * | 5/1985 | Kelly et al. | 324/115 |
| 4,748,404 A | * | 5/1988 | Heinze et al. | 324/114 |
| 4,808,914 A | * | 2/1989 | Talmor | 324/705 |
| 5,256,961 A | * | 10/1993 | Henkelmann | 324/115 |
| 5,572,117 A | * | 11/1996 | Yoon | 324/115 |
| 6,356,853 B1 | * | 3/2002 | Sullivan | 702/117 |

* cited by examiner

*Primary Examiner*—Daneil J. Wu
*Assistant Examiner*—Phung T Nguyen
(74) *Attorney, Agent, or Firm*—Troxell Law Office PLLC

(57) ABSTRACT

A hooking-type fully automatic electric meter with a function of fully automatic detecting and choosing a measuring mode among the electric current, voltage and resistance measuring modes. A user only needs to turn on the electric power of the electric meter without performing any other procedures; he can get an accurate reading of the volume of electricity on the display screen. The meter is different from the manually selected clamping type meters with different functional positions for measuring the values of electric current, voltage and resistance. With the meter, damage to the main body of the electric meter in operating electric measuring and to the safety of the user himself can be avoided. This can significantly raise the industrial safety in measuring large volume of electric current, and can save actions and time for operating the electric meter, and convenience and efficiency in operating can be increased.

8 Claims, 6 Drawing Sheets

HOOKING-TYPE FULLY AUTOMATIC ELECTRIC METER

BACKGROUND OF THE INVENTION

1. Field of the Invention

The present invention is related to a novel electric meter with a single key, and especially to a hooking-type fully automatic electric meter convenient for measuring in a hooking and hanging mode, a user only needs to turn on the electric power of the electric meter without performing any other procedures, he can get an accurate reading of the volume of electricity on the display screen. The electric meter has the function of fully automatic detecting and choosing a measuring mode among the electric current, voltage and resistance measuring modes.

2. Description of the Prior Art

Electric meters available nowadays can be divided generally into two kinds, those are the LCD (liquid crystal display) and the mechanical types. The meters normally seen, in addition to evident indication of the difference on the meters, are provided with operating rotation knobs for multi-stage function switching, and are provided near the difference indication with function indication to allow a user to manually select and move according to the detecting item he desire to switch to a related measuring electric character and to the position within the scope of value to be detected. Such a measuring mode practically still needs that a user has substantial ability of judging in electric measuring, an initial learner or one who is not familiar with this will induce a wrong measuring value by inaccurate selection of position, and even may damage the electric meter seriously when errors are resulted by wrong selection in using for high voltage or large current, and this may be dangerous to the safety of the user himself.

Although there has been automatic electric meters in the markets that can solve the defects stated above by unfamiliarity with position adjustment and control, they only have the basic functions of three kinds of automatic measuring including AC voltage, DC voltage and resistance measuring, and are unable to make an automatic measuring in a hooking and hanging mode, for an AC electric current. Thereby, the range of measuring of such meters is largely limited.

SUMMARY OF THE INVENTION

In view of the defects resided in the conventional single-key electric meters in application, the inventor of the present invention studied deeply and developed the novel electric meter of the present invention.

The main object of the present invention is to provide a fully automatic electric meter for fully automatic detecting and switching for choosing to do four kinds of measuring including AC voltage, DC voltage, AC electric current and resistance measurement in a mode of hooking and hanging on any electric line by a user at his own will.

The secondary object of the present invention is to provide a safe and accurate fully automatic hooking-mode electric meter with a sequential of priority of measuring and a judging function on related measuring electric characters. A user needs only to turn on the electric power of the electric meter without performing any otherr procedures, and can get an accurate reading of the volume of electricity on the display screen.

Another object of the present invention is to provide a fully automatic hooking-mode electric meter that is operated with a single key and has a stationary temporary "HOLD" mode in favor of convenient measuring electric values which are easily readable for discrimination.

To achieve the above objects, the fully automatic hooking-mode electric meter of the present invention is mainly comprised of: a main body of the electric meter provided thereon with a display and a single operating key (hold key power switch), the main body is provided at suitable positions thereon with insertion lines having detecting probes and is provided on the top thereof with an electric current sensing clamp receiving therein a current carrying conductor; a switching mechanism with an auto selection function for judging and selection through the main body of the electric meter under inputting from the outside during the "on" state of the electric meter, it can provide four kinds of measuring modes including DC voltage, AC voltage, electric resistance and AC electric current measuring; and a detecting mechanism with priority, with which, the signal inputting through the probes takes priority of the signal inputting through the electric current sensing clamp, the electric meter thereby can automatically intelligently switch by single key manipulating to save actions and time for operating the electric meter; and the electric meter can be hung by hooking on any electric line in favor of convenient observing the measuring electric values, thereby, convenience and efficiency in operating can be increased, and error of adjustment in operating by a user can be avoided, thus damage to the main body of the electric meter and to the safety of the user himself can be avoided too. This can significantly raise the industrial safety in measuring large volume of electric current.

The present invention will be apparent in its particular operation and functions after reading the detailed description of the preferred embodiments thereof in reference to the accompanying drawings.

DETAILED DESCRIPTION OF THE PREFERRED EMBODIMENT

Figure 1:
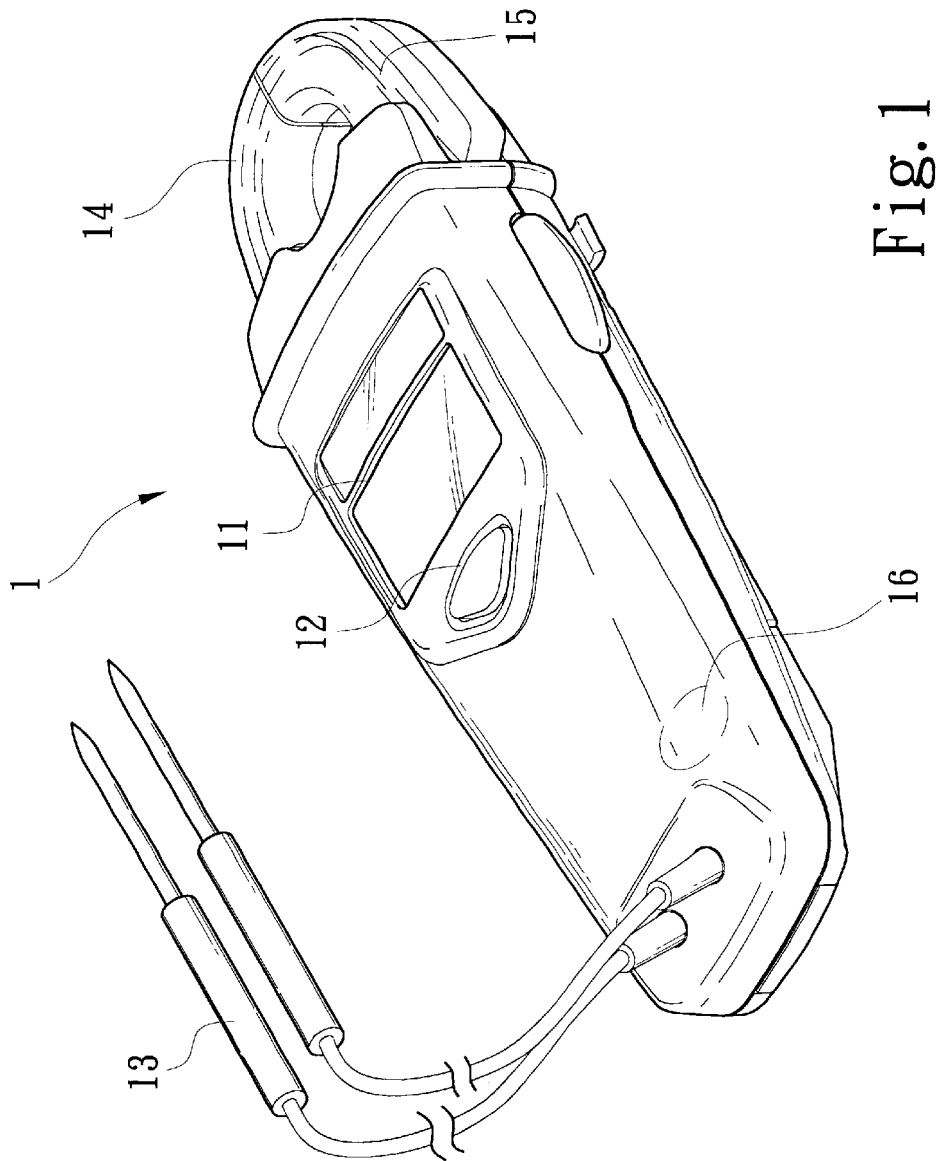
FIG. 1 is a perspective view showing the appearance of the hooking-type electric meter of the present invention.
Figure 2:
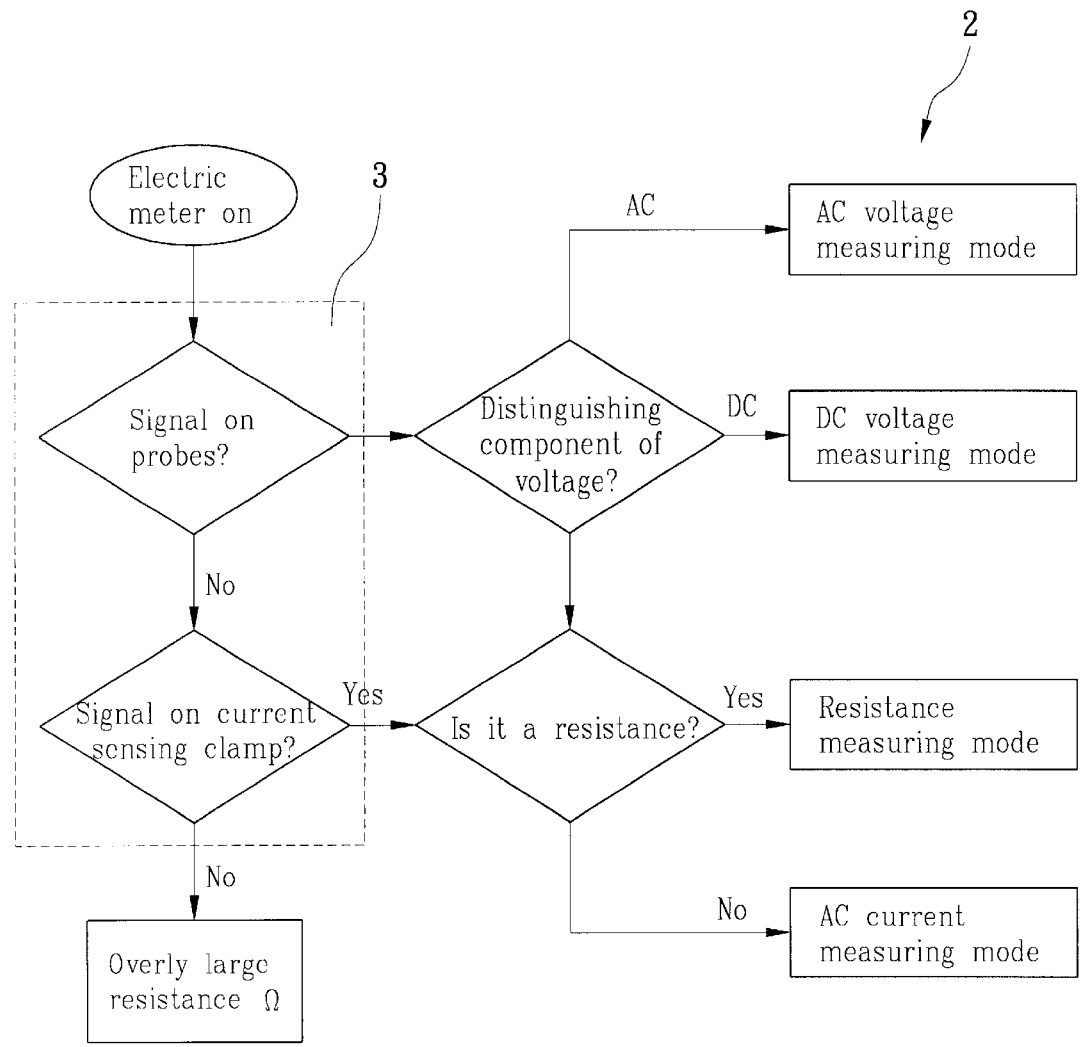
FIG. 2 is a process chart of the switching mechanism with an auto selection function mating with the detecting mechanism with priority of the present invention.
Figure 3:
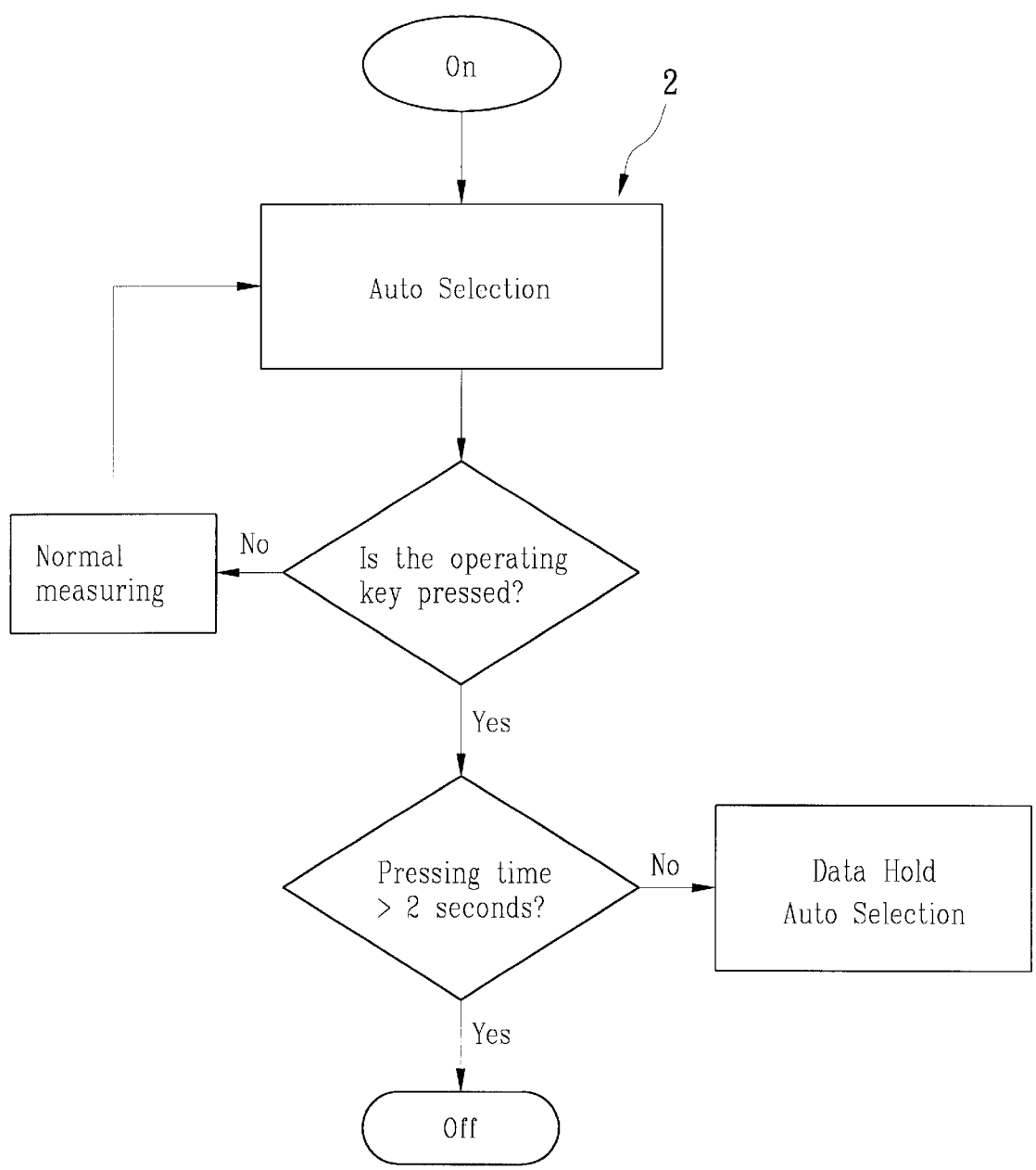
FIG. 3 is a process chart of the single operating key (hold key power switch) of the present invention.

Referring to FIGS. 1 to 5, the fully automatic hooking-mode electric meter of the present invention is comprised mainly of: a main body 1, a switching mechanism 2 with an auto selection function and a detecting mechanism 3 with priority. Wherein, the main body 1 is provided thereon with a display 11 and a single operating key (hold key power switch) 12, at suitable positions thereon with insertion lines having detecting probes 13, and is provided on the top thereof with an electric current sensing clamp 14 for receiving therein a current carrying conductor 15;

the switching mechanism 2 with an auto selection function is provided for judging and selection through the main body 1 of the electric meter under inputting from the outside during the "on" state of the electric meter, it can provide four kinds of measuring modes including DC voltage, AC voltage, electric resistance and AC electric current measurement;

with the detecting mechanism 3 with priority, the signal inputting through the probes 13 takes priority of the signal inputting through the electric current sensing clamp 14 when in automatic switching.

The main body 1 of the electric meter thereby can be automatically intelligently switched by single key manipulating to save actions and time for operating the electric meter; and the electric meter can be hung with the electric current sensing clamp 14 on any electric line in favor of convenient observing the measuring electric values, thereby, convenience and efficiency in operating can be increased, and error of adjustment in operating by a user can be avoided, thus damage to the main body 1 of the electric meter and to the safety of the user himself can be avoided too. This can significantly raise the industrial safety in measuring large volume of electric current.

In practice, the main body 1 of the electric meter of the present invention can be provided with a buzzer 16 to provide sound timely as a response to the state detected, in manufacturing the main body 1 of the electric meter, the top end thereof can be made narrower than the bottom end, so that the three-usage electric meter can be held easily, delicate designing of the sizes of the various parts thereof allows the three-usage electric meter to be used only with one hand, thereby, the single operating key (hold key power switch) 12 can be activated by any hand in holding the three-usage electric meter. And the single operating key (hold key power switch) 12 is activated in a stationary temporary "HOLD" mode, i.e., the single operating key (hold key power switch) 12 is operated to activate the three-usage electric meter when it is in the turning off state, and is operated to provide a twin function either of keeping the result of measuring on the display 11 or turning off the electric meter when it is in the turning on state. When in the stationary temporary "HOLD" mode, the result of measuring can be maintained on the display 11. It will be turned off by pressing ">2 seconds" once, and will activate the "HOLD" mode by pressing "<2 seconds" once, when it is in the turning on state; by pressing "<2 seconds" once more, the "HOLD" mode will be cancelled.

The four kinds of measuring modes including DC voltage, AC voltage, electric resistance and AC electric current measurement of the switching mechanism 2 with an auto selection function are automatically switched by the electric meter properly. During such automatic switching of the three-usage electric meter, the signal inputting mode through the probes 13 of the detecting mechanism 3 with priority takes priority of the signal inputting mode through the electric current sensing clamp 14; that is to say, when the probes 13 are able to measure signals in the DC voltage, the AC voltage or the electric resistance measuring mode, the relative value of the voltage or electric resistance measured is displayed; the value of the electric current measured by the electric current sensing clamp 14 is only displayed when there is no signal; if even the electric current sensing clamp 14 does not detect an electric current, an overly large electric resistance state Ω "OL" is displayed.

According to the above stated feature, a user can hook the electric meter on any electric line for convenience of observation of the value measured during measuring voltage or electric resistance, the electric meter can show the correct value of voltage or electric resistance no matter there is or is no current passing through the line; and when in measuring electric current, it needs only that the probes 13 are in the state of an open circuit, and there is no input signal, the electric current sensing clamp 14 is used to measure electric current. Thereby application of the three-usage electric meter can provide the user with more convenience and safety than conventional electric meters, there is no need of manual switching for measuring different signals.

The present invention is designed to be in a voltage measuring mode when the single operating key (hold key power switch) 12 is activated, if the ends of the probes 13 have voltage input, it distinguishes whether the AC voltage is larger than 0.9 V, whether the DC voltage is larger than 1.4 V or whether either the voltage is lower than −0.1, if is, it further distinguishes which of the DC component and the AC component is larger, and the display 11 shows the DC voltage or the AC voltage measuring mode with the larger component; if not, it is switched to the electric resistance measuring mode, and makes a judgment whether either of the resistances to be measured on the two ends of the probes 13 is smaller than 2000 Ohms, if is, the resistance value measured is displayed, if not, it is switched to the electric current measuring mode, and makes a judgment whether there is an electric current on either of the two ends of the electric current sensing clamp 14. of the two ends of the electric current sensing clamp 14.

Figure 4A:
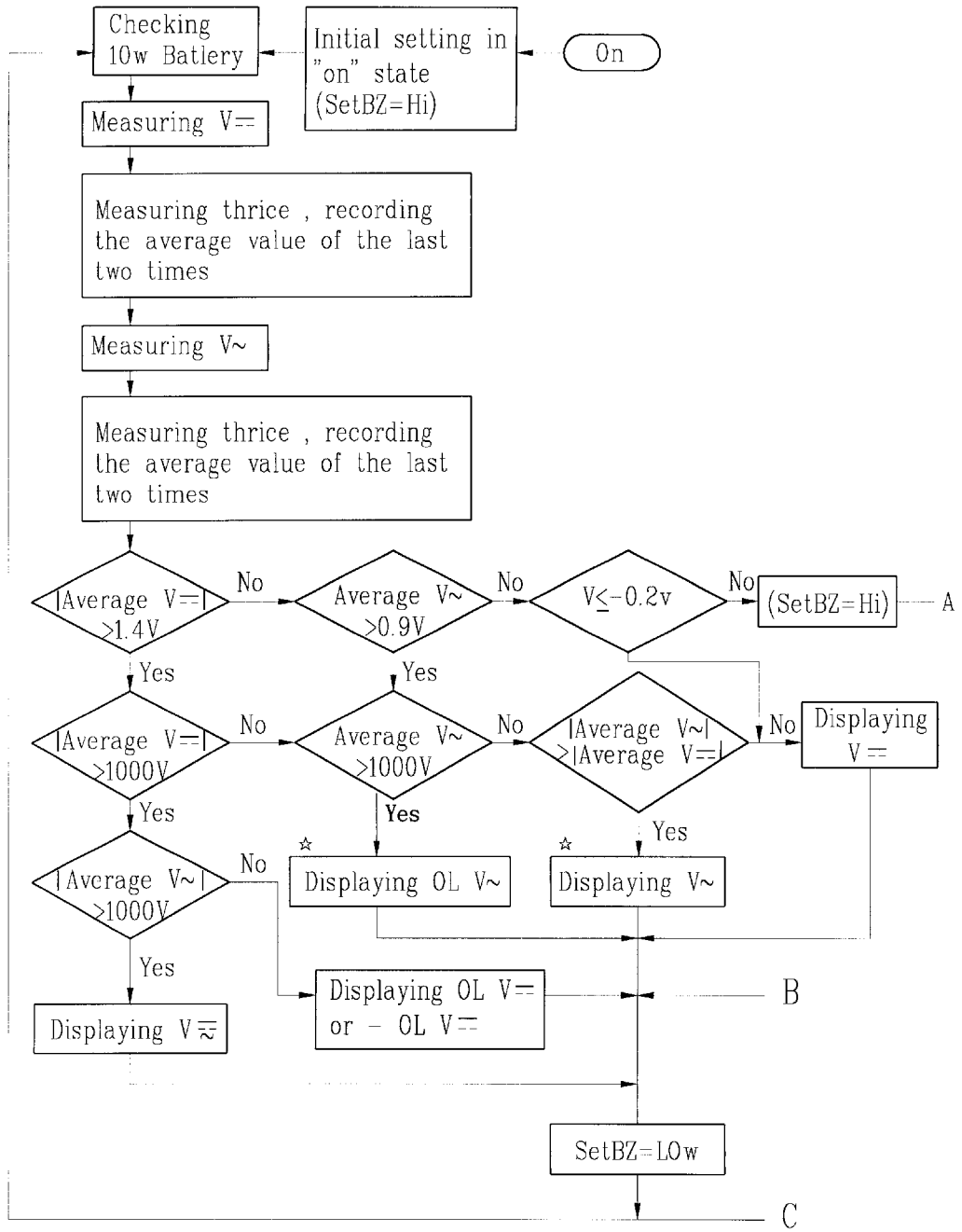
FIG. 4 is a detailed process chart of the switching mechanism with an auto selection function of the present invention.
Figure 4B:
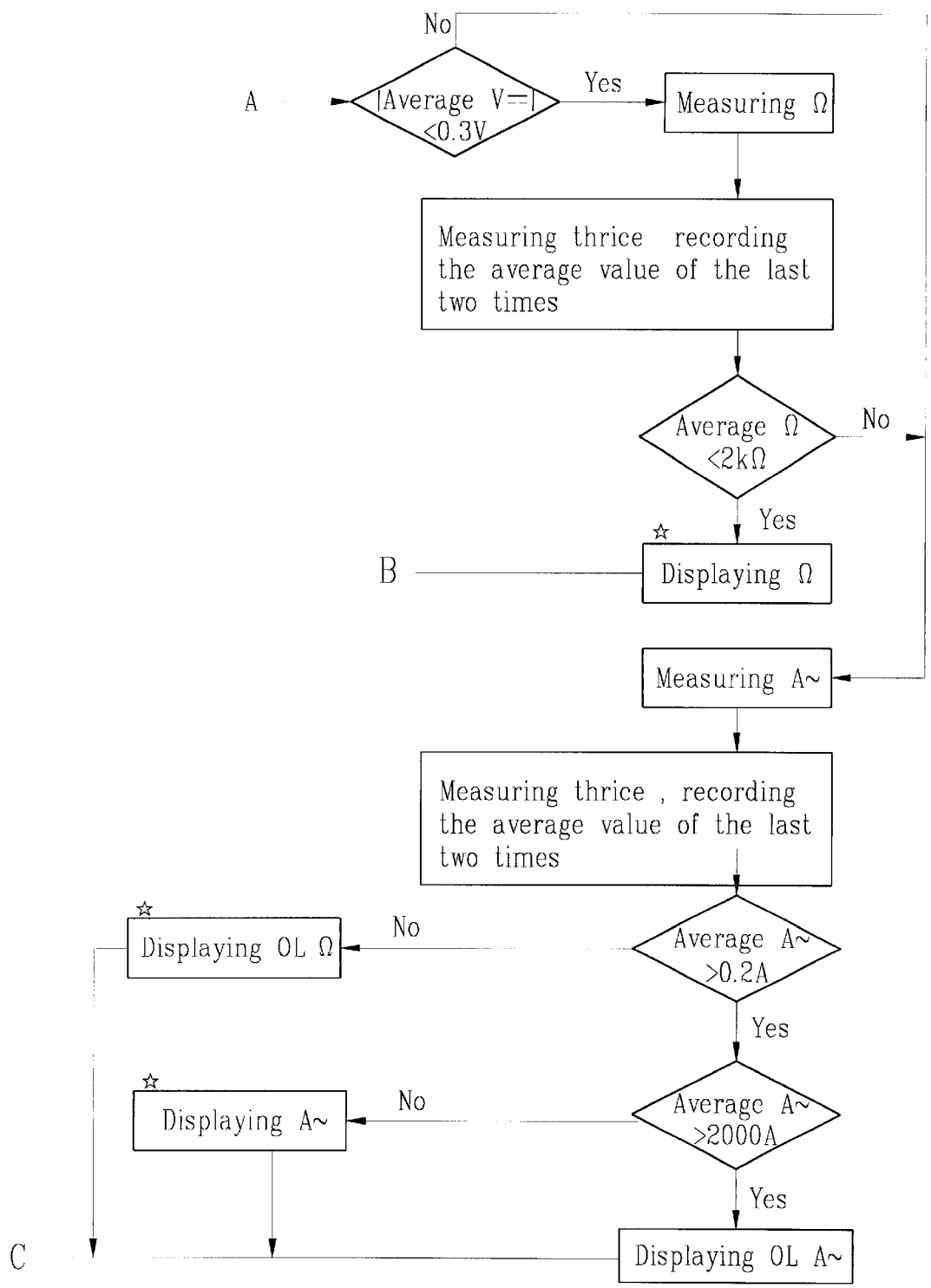

The more detailed actions are shown in FIG. 4, after the present invention is activated and enters the initial set up state and examines the electricity volume of the battery, it measures DC voltage in the first place, after measuring thrice, the average value of the latter two times of measuring is recorded, and then the following serial judgements are performed:

a. If the result shows that the DC voltage and the AC voltage are both larger than 1000 V, an "OL" signal of an overly large AC voltage is displayed. If the AC value measured is not larger than 1000 V, then only an "OL" signal of an overly large DC voltage is displayed.

b. If the DC value measured is between 1.5~1000 V or smaller than −0.2 V, an AC judgment is executed; if it is larger than 1000 V, the "OL" signal of an overly large AC voltage is displayed. If it is not either of the above stated cases, and if the average value of the-AC voltage is larger than the absolute value out of the average value of the DC voltage, the value measured and displayed is an AC value; on the contrary, the value measured and displayed is a DC value.

c. If the DC voltage measured is lower than 1.5 V, and the AC voltage is not larger than 0.9 V, and if the absolute value of the DC voltage value measured is equal to or smaller than 0.3 V, the present invention is automatically switched to the electric resistance measuring mode; if the absolute value is larger than 0.3 V, the present invention is automatically switched to the AC electric current measuring mode.

d. In entering the electric resistance measuring mode, after measuring thrice, the average value of the latter two times of measuring is recorded, if the average value of the electric resistance is judged to be smaller than 2000 Ohms, the resistance measured is displayed; if the average value is larger than 2000 Ohms, the present invention skips to the AC electric current measuring mode.

e. In entering the AC electric current measuring mode, similarly, after measuring thrice, the average value of the latter two times of measuring is recorded, if the average value of the AC electric current is larger than 2000 A, an "OL" signal of an overly large AC current measured is displayed; if the average value is between 0.3~2000 A, the value measured and displayed is an AC current value; and if the average value of the AC electric current is smaller than 0.3 A, an "ΩOL" signal of an overly large electric resistance is displayed.

Figure 5:
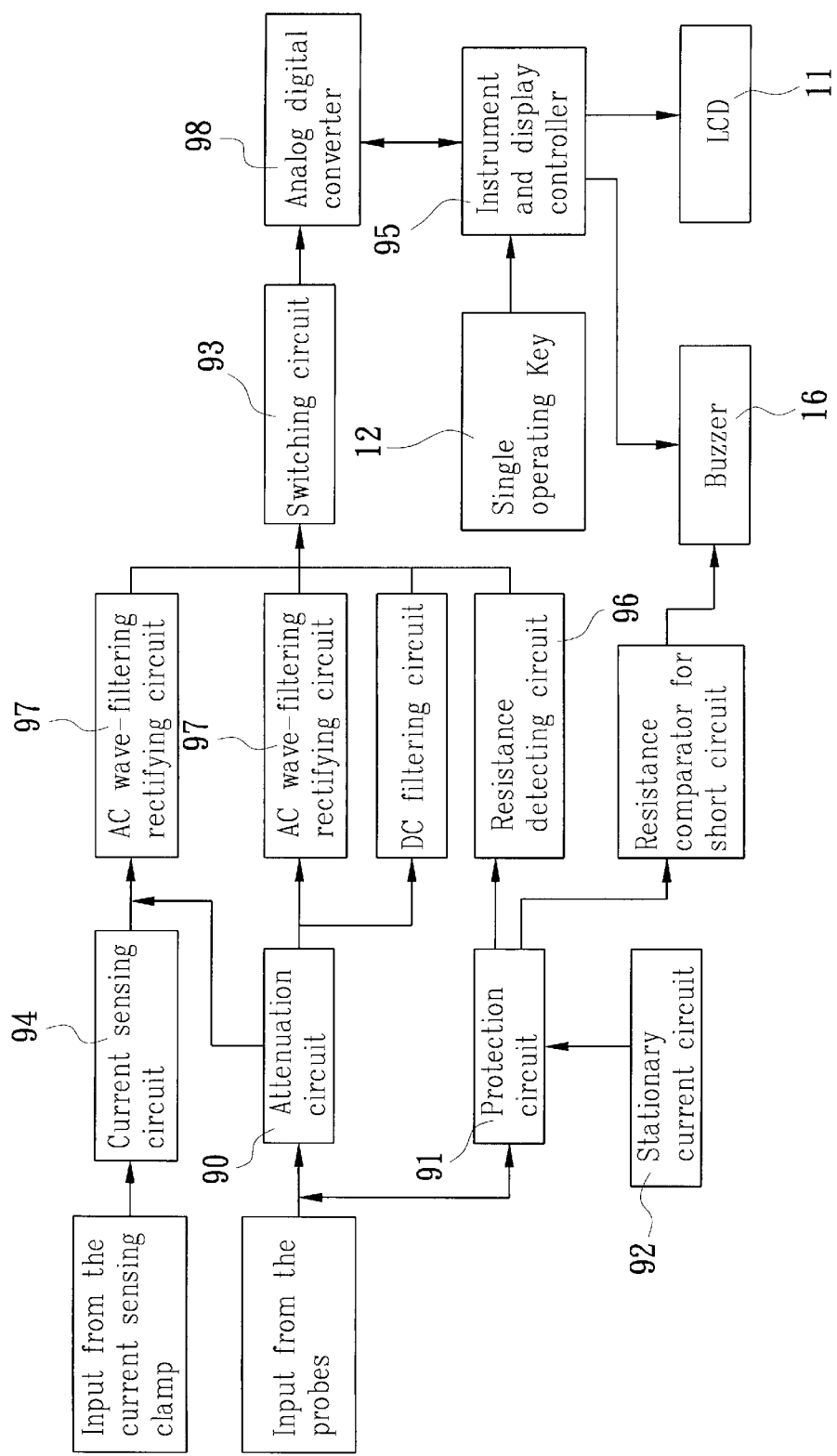
FIG. 5 shows an internal circuit diagram of the intelligent hooking-type electric meter of the present invention.

Referring to FIG. 5 showing an internal circuit diagram of the electric circuitry of the present invention, wherein, in addition to the above mentioned LCD display 11, the buzzer 16, a control power circuit 99 and the single operating key (hold key power switch) 12 of the "HOLD" mode, it further includes:

- an attenuation circuit 90 and a protection circuit 91 both in coupling with the probes 13;
- a stationary current circuit 92 providing a testing current for the protection circuit 91 in the electric resistance measuring mode, the electric current couples with an unknown electric resistance RX through the probes 13, the voltage drop straddling the unknown electric resistance RX can be measured, and the electric resistance can be calculated by the following formula:
  RX=voltage drop/testing electric current;
  the electric resistance measuring mode can also include a series of tests, wherein, the resistance between the probes 13 and being smaller than a critical resistance value is deemed as a short circuit, this will be indicated by the sound from the buzzer 16;
- a switching circuit 93 used to switch among the input signal sources including the signals from an electric current sensing circuit 94 stated hereinafter or ACV, DCV of the attenuation circuit 90 or the electric resistance signals from an electric resistance detecting circuit 96 stated hereinafter, and to output the DC signals;
- an instrument and display controller 95, it deals with the formalization and conversion of the measured digital value into the desired form required by the display 11, and controls the gain of the electric current sensing circuit 94 and the ratio of attenuation of the attenuation circuit 90 for ACV as well as the volume of the sound of the buzzer 16;
- the electric resistance detecting circuit 96 provided to detect whether the type of the signal under measuring is a voltage or electric resistance type in order to provide this to control the switching circuit 93 and the instrument and display controller 95 respectively for switching and to display the electric resistance value;
- the electric current sensing circuit 94 including an amplifier, a voltage divider and the above mentioned electric current sensing clamp 14, in order that the electric current sensing clamp 14 detects the electric current to generate AC signals in coupling with and sent to an AC wave filtering rectifier circuit 97, to thereby convert the AC signals into DC signals suitable for converting into a measured digital value; and
- an analog/digital converter 98 to convert the measured value into the measured digital value and sent it to the instrument and display controller 95 as a displaying and discriminating condition and is displayed.

Wherein, the attenuation circuit 90 provides an adjusted input voltage for the above mentioned switching circuit 93 and AC wave filtering rectifier circuit 97, the switching circuit 93 is controlled by the instrument and display controller 95 to output a corresponding voltage, an electric current or an electric resistance to the ADC analog/digital converter 98 according to the measuring mode now.

The instrument and display controller 95 decides the measuring mode in pursuance of the quality and size of the input signals, thereby to control the states of the switching circuit 93 and the display 11 and to receive the signals from the single operating key (hold key power switch) 12, and to maintain the state of the display 11 or turn off the same according to the length of time of the signals.

The actual product obtained by cooperation of the above stated hardware and firmware can provide the following functions to render a user to operate an electric meter more easily in a more humanized way:

1. When the switching mechanism 2 with an auto selection function (ASF) selecting among Ω, V (DC), V (AC) and A (AC) of the electric meter is activated, it is started from V (DC), the LCD displays the symbol of "AUTO SET".
2. "DATA HOLD" mode is not activated when the electric meter is on; if the single operating key (hold key power switch) 12 is pressed for less than 2 seconds in this "on" state of the electric meter, the mode will be activated, if it is pressed for more than 2 seconds, the electric meter is turned off. When the "HOLD" mode is activated, a sound is given and the LCD displays the symbol of "H"; at this time, the screen is unchanged, the function of ASF is stopped, and measuring of A/D is not switched. When the function of "HOLD" is turned off, another sound is given.
3. Whenever the V (DC) is measured again, A/D is checked to see whether there is a signal of low battery.
4. A sound is given at the start of activating the electric meter, and the LCD is fully lightened.
5. When the user does not operate 30 minutes after the last operation, the electric meter is automatically turned off, or if the user presses the single operating key (hold key power switch) 12 for more than 2 seconds, the LCD is cleared out, and a sound is given as an indication.
6. Other conditions of indication:
   For changing the LCD display function, a sound is given; for activating the electric meter, a sound is immediately given; for turning off the electric meter, a sound is immediately given in the LCD; when the Ohm value is <100Ω, a sustaining sound is given; when the function of "HOLD" is turned on or off, a sound is given; when a value is overly large, a sound is given.

From the above stated, the present invention can surely achieve the above objects, the present invention thereby is industrially valuable. And the above statement described a preferred embodiment of the present invention. It will be apparent to those skilled in this art that various modifications or changes can be made to the present invention without departing from the spirit, scope and characteristic of this invention; all such modifications and changes shall fall within the scope of the appended claims.

What is claimed is:

1. A hooking-type fully automatic electric meter with hooking means comprising:
   a main body being provided thereon with a display and a single operating key being provided at suitable positions thereon with detecting probes, and being provided on the top thereof with an electric current sensing clamp for receiving therein a current carrying conductor;
   a switching mechanism with an auto selection function being provided for judging and selection through said main body of said electric meter under inputting from the outside during activating of said electric meter, it provides four kinds of measuring modes including DC voltage, AC voltage, electric resistance and AC electric current measurement;

a detecting mechanism with priority with which the signal inputting through said probes takes priority of the signal inputting through said electric current sensing clamp when in automatic switching;

said main body of said electric meter thereby is automatically intelligently switched by single key manipulating to save actions and time for operating; and said electric meter is adapted to hanging with said electric current sensing clamp on any electric line in favor of convenient observing the measured electric values, thereby, convenience and efficiency in operating can be increased, and error of adjustment in operating by a user can be avoided, this significantly raise the industrial safety in measuring large volume of electric current.

2. The hooking-type fully automatic electric meter as claimed in claim 1, wherein, when said electric meter gets measures of signals in any of said four kinds of measuring modes including DC voltage, AC voltage, electric resistance or AC electric current measuring modes through the ends of said probes, the relative value of voltage or electric resistance measured is displayed; the value of electric current measured by said electric current sensing clamp is only displayed when there is no signal when said probes form an open circuit; if even said electric current sensing clamp does not detect an electric current, an overly large electric resistance state "OL" is displayed.

3. The hooking-type fully automatic electric meter as claimed in claim 1, wherein, said single operating key is used to activate said electric meter, and is activated in a "HOLD" mode, the result of measuring is maintained on said display; said single operating key (hold key power switch) is turned off by pressing ">2 seconds" once, and activates said "HOLD" mode by pressing "<2 seconds" once, when it is in said activated state; by pressing "<2 seconds" once more, said "HOLD" mode is cancelled.

4. The hooking-type fully automatic electric meter as claimed in claim 1, wherein, in addition to said LCD display, a buzzer and said single operating key controlling power, said electric meter further includes in the electric circuit thereof:

an attenuation circuit and a protection circuit both in coupling with said probes;

a stationary current circuit providing a testing current for said protection circuit in said electric resistance measuring mode;

a switching circuit used to switch among input signal sources including the signals from an electric current sensing circuit described below, the signals from said attenuation circuit or from an electric resistance detecting circuit described below, and to output DC signals;

an instrument and display controller dealing with the formalization and conversion of a measured digital value into the desired form required by said display;

said electric resistance detecting circuit provided to detect whether the type of the signal under measuring is a voltage or electric resistance type in order to provide this to control said switching circuit and said instrument and display controller respectively for switching and to display an electric resistance value;

said electric current sensing circuit including an amplifier, a voltage divider and said electric current sensing clamp, said electric current sensing clamp detects an electric current to generate AC signals in coupling with and sent to an AC wave filtering rectifier circuit, to thereby convert AC signals into DC signals suitable for converting into a measured digital value; and an analog/digital converter to convert a measured value into a measured digital value and sent it to said instrument and display controller as a displaying and discriminating condition and is displayed.

5. The hooking-type fully automatic electric meter as claimed in claim 4, wherein, said attenuation circuit provides an adjusted input voltage for said switching circuit and said AC wave filtering rectifier circuit, said switching circuit is controlled by said instrument and display controller to output a corresponding voltage, an electric current or an electric resistance to said analog/digital converter according to one of said measuring modes now.

6. The hooking-type fully automatic electric meter as claimed in claim 4, wherein, said instrument and display controller decides one of said measuring modes in pursuance of the quality and size of the input signals, thereby to control the states of said switching circuit and said display and to receive the signals from said single operating key, to maintain the state of said display or turn off the same according to the length of time of said signals.

7. The hooking-type fully automatic electric meter as claimed in claim 1, wherein, said main body of said electric meter is provided with a buzzer, the top end is made narrower than the bottom end thereof, so that said electric meter is adapted to holding easily with a hand by delicate designing of the sizes of various parts thereof; said electric resistance measuring mode includes a series of tests, wherein, the resistance between said probes and being smaller than a critical resistance value is deemed as a short circuit, this is indicated by said display and a sound.

8. The hooking-type fully automatic electric meter as claimed in claim 1, wherein, after said electric meter is activated and enters an initial set up state and examines the electricity volume of its battery, it measures DC voltage in the first place, after measuring thrice, an average value of the latter two times of measuring is recorded, and then the following serial judgements are performed:

a. when a result shows that a DC voltage and an AC voltage are both larger than 1000 V, an "OL" signal of an overly large AC voltage is displayed; when the AC value measured is not larger than 1000 V, then only an "OL" signal of an overly large DC voltage is displayed;

b. when said DC voltage measured is between 1.5~1000 V or smaller than −0.2 V, an AC judgment is executed; when it is larger than 1000 V, an "OL" signal of an overly large AC voltage is displayed; when it is not larger than 1000 V, and when the average value of said AC voltage is larger than an absolute value out of the average value of said DC voltage, the value measured and displayed is an AC value; on the contrary, said value measured and displayed is a DC value;

c. when said DC voltage measured is lower than 1.5 V, and said AC voltage is not larger than 0.9 V, and the absolute value of said DC voltage value measured is equal to or smaller than 0.3 V, said electric meter is automatically switched to said electric resistance measuring mode; when said absolute value of said DC voltage value measured is larger than 0.3 V, said electric meter is automatically switched to said AC electric current measuring mode;

d. in entering said electric resistance measuring mode, after measuring thrice, an average value of the latter two times of measuring is recorded, when said average value of the electric resistance is judged to be smaller than 2000 Ohms, the resistance measured is displayed; when said average value is larger than 2000 Ohms, said electric meter skips to said AC electric current measuring mode;

e. in entering said AC electric current measuring mode, similarly, after measuring thrice, an average value of the latter two times of measuring is recorded, when the average value of the AC electric current is larger than 2000 A, an "OL" signal of an overly large AC current measured is displayed; when said average value is between 0.3~2000 A, the value measured and displayed is an AC current value; and when said average value is smaller than 0.3 A, an "$\Omega$OL" signal of an overly large electric resistance is displayed.

* * * * *